United States Patent
Katsunuma

(10) Patent No.: US 10,854,430 B2
(45) Date of Patent: Dec. 1, 2020

(54) PLASMA ETCHING METHOD

(71) Applicant: TOKYO ELECTRON LIMITED, Tokyo (JP)

(72) Inventor: Takayuki Katsunuma, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 309 days.

(21) Appl. No.: 15/825,308

(22) Filed: Nov. 29, 2017

(65) Prior Publication Data

US 2018/0151333 A1   May 31, 2018

(30) Foreign Application Priority Data

Nov. 30, 2016   (JP) .................. 2016-232643
Nov. 7, 2017   (JP) .................. 2017-214314

(51) Int. Cl.
*H01J 37/00*  (2006.01)
*H01J 37/32*  (2006.01)
*B23K 10/00*  (2006.01)

(52) U.S. Cl.
CPC .. *H01J 37/32366* (2013.01); *H01J 37/32449* (2013.01)

(58) Field of Classification Search
CPC .. H05H 1/34; H05H 1/26; H05H 1/30; H05H 1/42; H01J 37/32366; H01J 37/32449
USPC ............ 219/121.41, 121.44, 121.43, 121.54
See application file for complete search history.

(56) References Cited

U.S. PATENT DOCUMENTS

| | | | |
|---|---|---|---|
| 8,425,789 B2 * | 4/2013 | Kobrin | H01L 21/0337 216/37 |
| 9,543,148 B1 * | 1/2017 | Hudson | H01L 21/6719 |
| 2005/0161435 A1 | 7/2005 | Kobayashi | |
| 2010/0273332 A1 * | 10/2010 | Edelberg | H01J 37/32091 438/710 |
| 2011/0049492 A1 * | 3/2011 | Sawaki | B82Y 10/00 257/40 |
| 2015/0340243 A1 * | 11/2015 | Kikuchi | H01L 21/31116 438/700 |

FOREIGN PATENT DOCUMENTS

JP   2003-282539 A   10/2003
JP   2014-82228 A   5/2014

* cited by examiner

*Primary Examiner* — Mark H Paschall
(74) *Attorney, Agent, or Firm* — Rothwell, Figg, Ernst & Manbeck, P.C.

(57) ABSTRACT

In a plasma etching method, a deposit containing an element forming an upper electrode is deposited on a metal-containing mask having a predetermined pattern while sputtering the upper electrode by a plasma of a first processing gas. Then, an etching target film is etched by a plasma of a second processing gas while using the metal-containing mask on which the deposit is deposited as a mask.

19 Claims, 8 Drawing Sheets

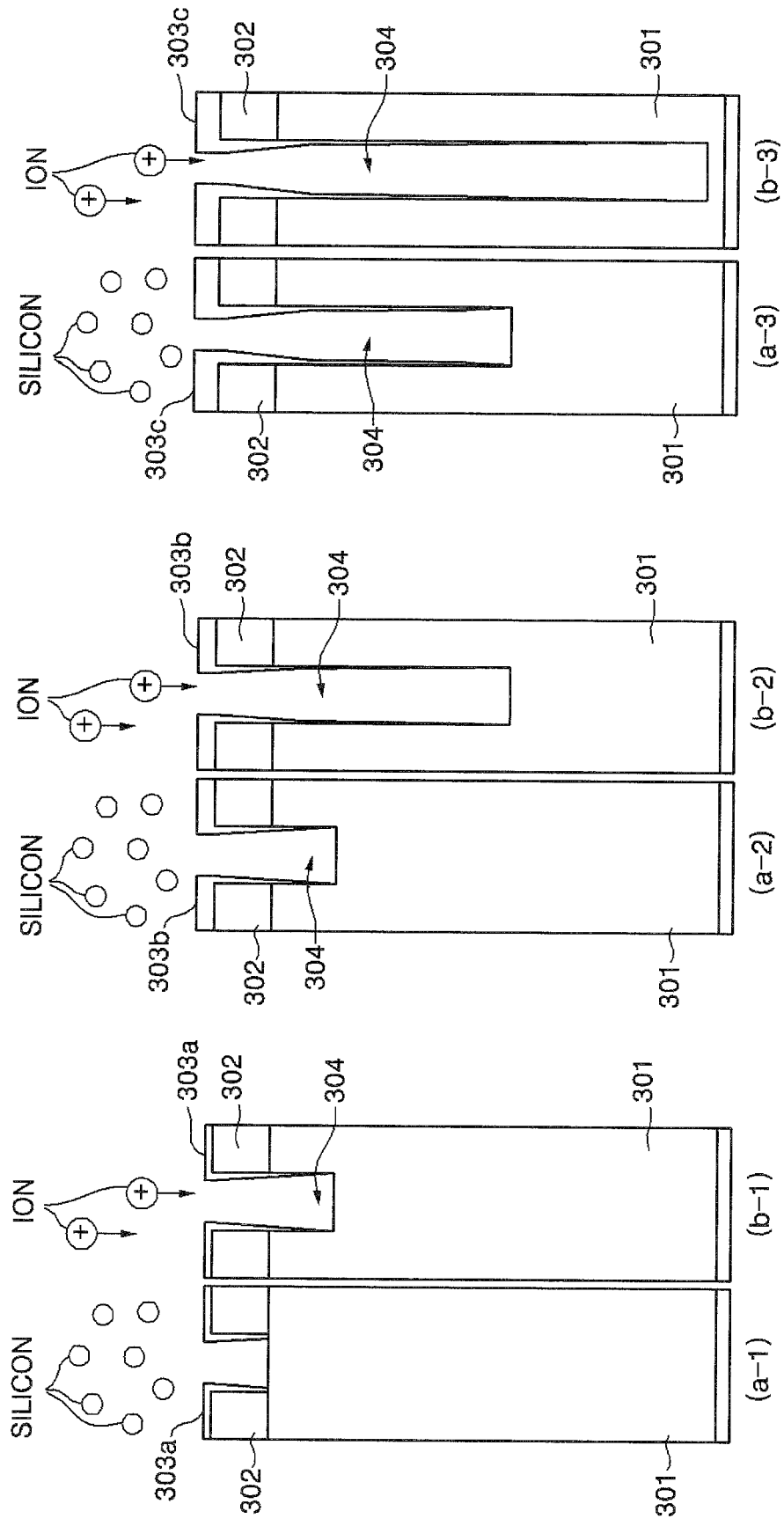

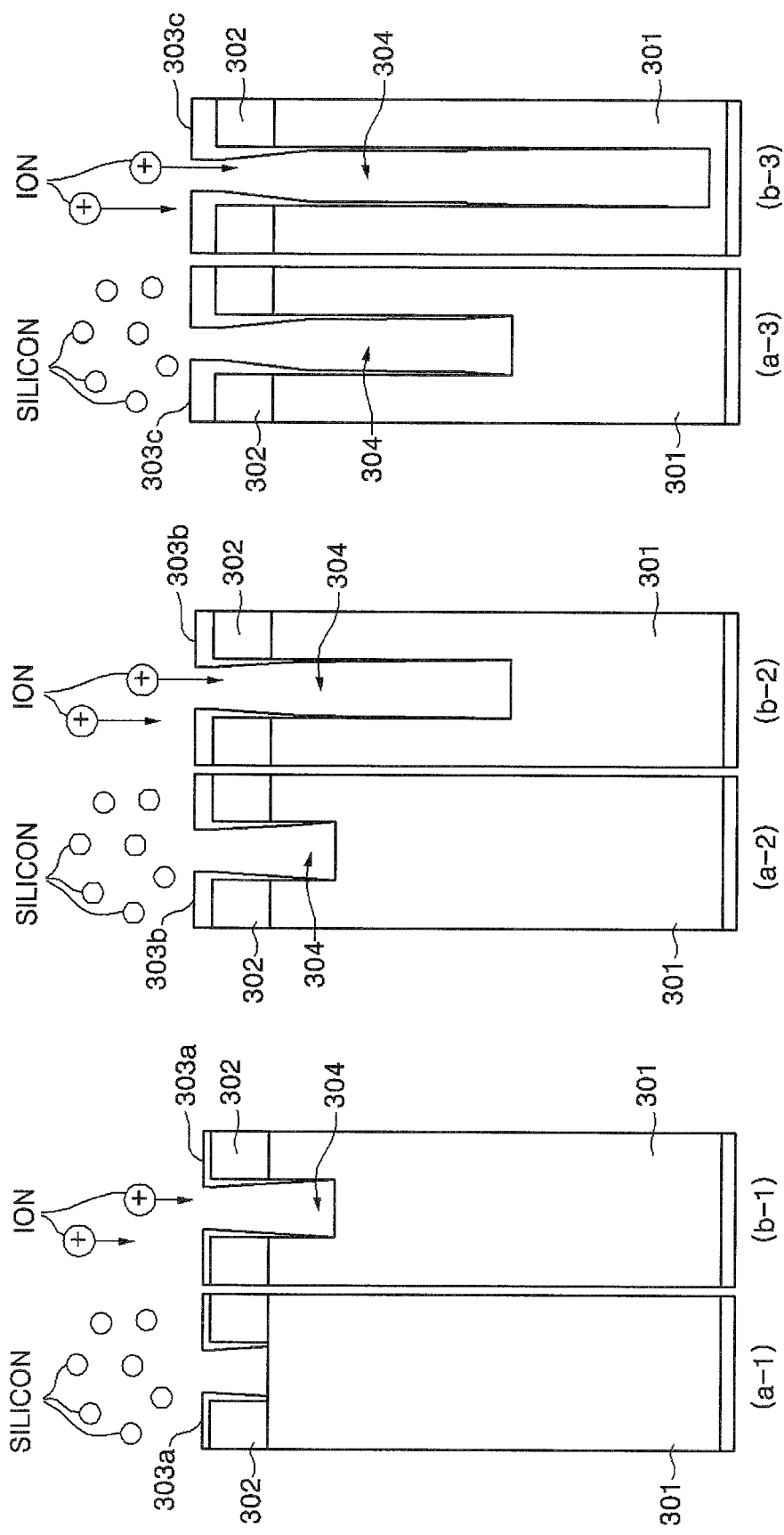

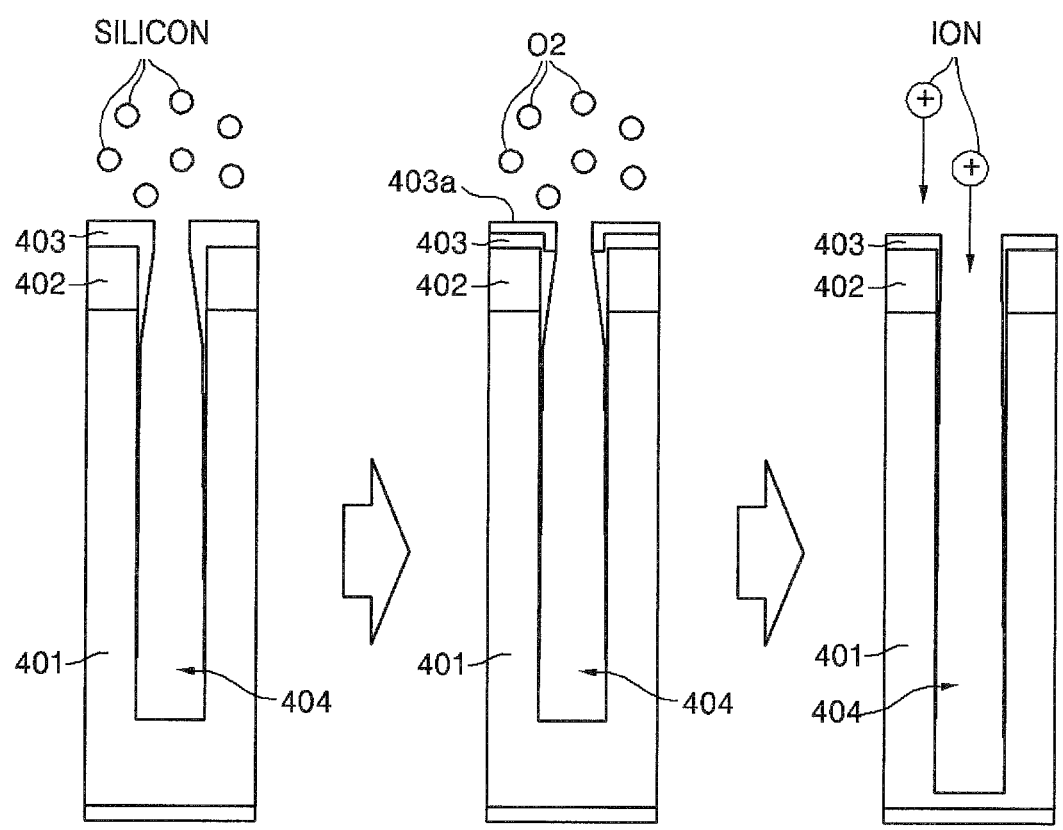

PLASMA ETCHING METHOD

CROSS-REFERENCE TO RELATED APPLICATIONS

This application claims priority to Japanese Patent Application Nos. 2016-232643 and 2017-214314 respectively filed on Nov. 30, 2016 and Nov. 7, 2017, the entire contents of which are incorporated herein by reference.

FIELD OF THE INVENTION

The disclosure relates to a plasma etching method and a plasma etching apparatus.

BACKGROUND OF THE INVENTION

Conventionally, a plasma etching apparatus etches an etching target film while using a photoresist or a metal-containing mask as a mask. In the case of using the photoresist as the mask, a silicon-containing deposit may be deposited as a protective film on a surface of the photoresist by a plasma of a processing gas while applying a negative DC voltage to a silicon-containing upper electrode (see, e.g., Japanese Patent Application Publication Nos. 2003-282539 and 2014-82228).

However, in the plasma etching apparatus, there is no consideration to avoid etching stop caused by a material of the mask when the metal-containing mask is used as the mask. In other words, in the plasma etching apparatus, when the metal-containing mask is used as the mask, a metal scattering from the metal-containing mask is attached as a metal compound on the etching target film and, thus, the etching of the etching target film is disturbed, which results in occurrence of etching stop.

SUMMARY OF THE INVENTION

In accordance with an aspect, there is provided a plasma etching method including: depositing a deposit containing an element forming an upper electrode on a metal-containing mask having a predetermined pattern while sputtering the upper electrode by a plasma of a first processing gas; and etching an etching target film by a plasma of a second processing gas while using the metal-containing mask on which the deposit is deposited as a mask.

BRIEF DESCRIPTION OF THE DRAWINGS

The objects and features of the disclosure will become apparent from the following description of embodiments, given in conjunction with the accompanying drawings, in which:

FIGS. 5A to 5C show exemplary cross sections of a wafer W after each process in the case of repeating a deposition process and an etching process;

FIGS. 6A to 6C show exemplary cross sections of a wafer W after each process in the case of repeating a deposition process and an etching process;

FIGS. 7A to 7C show exemplary cross sections of a wafer W after each process in the case of performing an oxidation process between a deposition process and an etching process.

DETAILED DESCRIPTION OF THE EMBODIMENTS

Hereinafter, embodiments of a plasma etching method and a plasma etching apparatus will be described in detail with reference to the accompanying drawings. However, the present disclosure is not limited to those embodiments. The embodiments may be appropriately combined without contradicting processing contents.

(Plasma Etching Apparatus According to an Embodiment)

Figure 1:
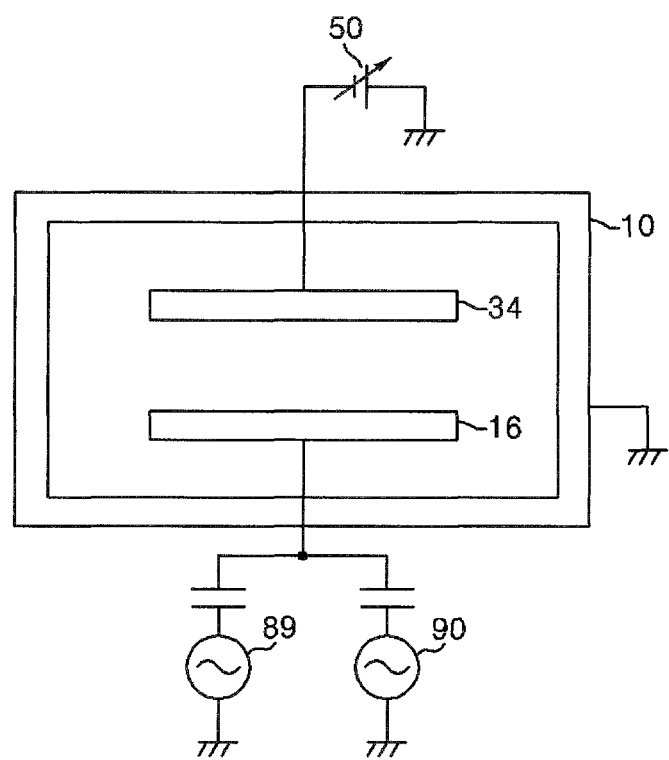
FIG. 1 is a simplified cross sectional view schematically showing a plasma etching apparatus according to an embodiment.

FIG. 1 is a simplified cross sectional view schematically showing a plasma etching apparatus according to an embodiment. As shown in FIG. 1, the plasma etching apparatus is of a lower side dual frequency application type in which a high frequency (or radio frequency (RF)) power for plasma generation having a frequency of, e.g., 40 MHz, and a high frequency (RF) power for ion attraction having a frequency of, e.g., 2 MHz, are respectively applied from a first and a second high frequency power supply 89 and 90 to a susceptor 16 serving as a lower electrode. As shown in FIG. 1, in this plasma etching apparatus, a predetermined DC voltage is applied to an upper electrode 34 connected to a variable DC power supply 50.

Figure 2:
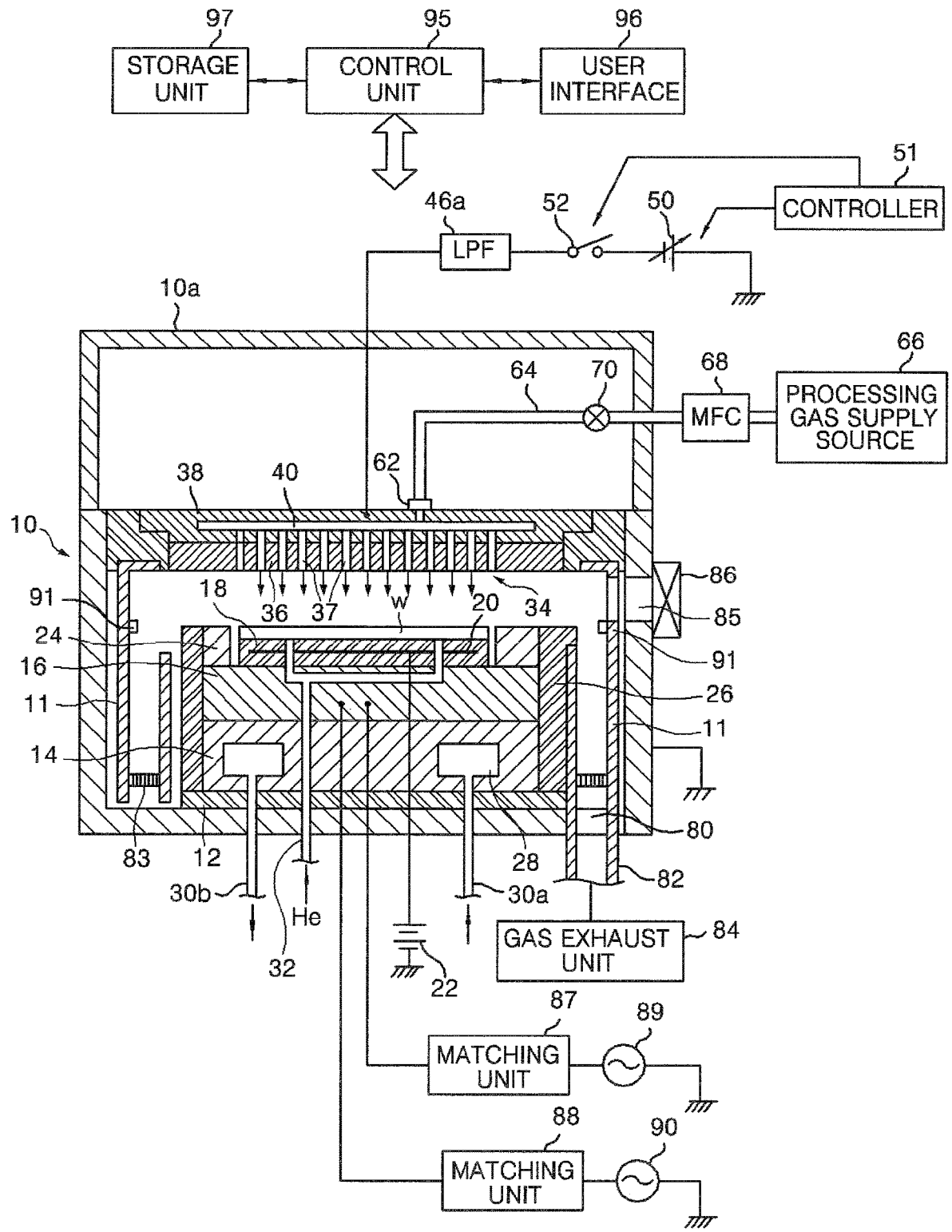
FIG. 2 is a schematic cross sectional view of the plasma etching apparatus according to the embodiment.

FIG. 2 is a schematic cross sectional view of the plasma etching apparatus according to the embodiment. The plasma etching apparatus is configured as a capacitively coupled parallel plate type plasma etching apparatus including a substantially cylindrical chamber (processing chamber) 10 having a surface made of, e.g., anodically oxidized aluminum. The chamber 10 is grounded.

A columnar susceptor support 14 made of ceramic or the like is provided on a bottom portion of the chamber 10 through an insulating plate 12 made of ceramic or the like. A susceptor 16 made of, e.g., aluminum, is provided on the susceptor support 14. The susceptor 16 serving as the lower electrode mounts thereon a semiconductor wafer (hereinafter, referred to as "wafer") W that is a processing target object.

An electrostatic chuck 18 for attracting and holding the wafer W by an electrostatic force is provided on a top surface of the susceptor 16. The electrostatic chuck 18 has a structure in which an electrode 20 made of a conductive film is interposed between two insulating layers or two insulating sheets. The electrode 20 is electrically connected to a DC power supply 22. The wafer W is attracted and held on the electrostatic chuck 18 by the electrostatic force such as a Coulomb force generated by a DC voltage from the DC power supply 22.

A conductive focus ring (correction ring) 24 for improving etching uniformity is provided on the top surface of the susceptor 16 around the electrostatic chuck 18 (wafer W). The focus ring 24 is made of, e.g., silicon. A cylindrical inner wall member 26 made of, e.g., quartz, is provided on side surfaces of the susceptor 16 and the susceptor support 14.

A coolant channel 28 extending in a circumferential direction is provided inside the susceptor support 14. A coolant having a predetermined temperature is supplied to the coolant channel 28 from a chiller unit (not shown) provided at the outside through lines 30a and 30b and circulated therein. A processing temperature of the wafer W on the susceptor 16 is controlled by a temperature of the coolant.

A heat transfer gas, e.g., He gas, from a heat transfer gas supply unit (not shown) is supplied to a gap between a top surface of the electrostatic chuck 18 and a backside of the wafer W through a gas supply line 32.

An upper electrode 43 is provided above the susceptor 16 serving as the lower electrode to face the susceptor 16 in parallel therewith. A space between the upper electrode 34 and the lower electrode 16 serves as a plasma generation space. The upper electrode 34 has a surface, i.e., a facing surface, in contact with the plasma generation space while facing the wafer W on the susceptor 16 serving as the lower electrode.

The upper electrode 34 is supported at an upper portion of the chamber 10 through an insulating shield member 42. The upper electrode 34 includes an electrode plate 36 having the facing surface which faces the susceptor and an electrode holder 8 for detachably holding the electrode plate 36. The electrode plate 36 has a plurality of gas injection holes 37. The electrode holder 8 is made of a conductive material and has a water-cooling structure. The conductive material forming the electrode holder 8 is, e.g., aluminum having an anodically oxidized surface. The electrode plate 36 is made of a silicon-containing material, e.g., silicon. A gas diffusion space 40 is formed inside the electrode holder 8. A plurality of gas through holes 41 communicating with the gas injection holes 37 extends downward from the gas diffusion space 40.

A gas inlet port 62 for guiding a processing gas to the gas diffusion space 40 is formed at the electrode holder 8. A gas supply line 64 is connected to the gas inlet port 62. A processing gas supply source 66 is connected to the gas supply line 64. A mass flow controller (MFC) 68 and an opening/closing valve 70 are provided in the gas supply line in that order from an upstream side thereof. A processing gas for etching, e.g., fluorocarbon gas ($C_xF_y$) such as $C_4F_8$ gas, is supplied from the processing gas supply source 66 to the gas diffusion space 40 through the gas supply line 64 and then injected to the plasma generation space in a shower shape through the gas through holes 41 and the gas injection holes 37. In other words, the upper electrode 34 serves as a shower head for supplying the processing gas.

As will be described later, a processing gas used for depositing a silicon-containing deposit, and a processing gas used for etching or the like are supplied from the processing gas supply source 66. The gas supplied from the processing gas supply source 66 will be described in detail later.

A variable DC power supply 50 is electrically connected to the upper electrode 34 via a low pass filter LPF 46a. The variable DC power supply 50 may be a bipolar power supply. The power supply of the variable DC power supply 50 can be on-off controlled by an on/off switch 52. Polarity and current/voltage of the variable DC power supply and on/off operation of the on/off switch 52 are controlled by a controller (control device) 51.

The LPF 46a is used for trapping a high frequency from a first and a second high frequency power supply to be described later. The LPF 46a preferably includes an LR filter or an LC filter.

A cylindrical ground conductor 10a extends upward from a sidewall of the chamber 10 to be located at a position higher than the upper electrode 34. The cylindrical ground conductor 10a has a ceiling wall at the top thereof.

The first high frequency power supply 89 is electrically connected to the susceptor 16 serving as the lower electrode via a matching unit 87. The second high frequency power supply 90 is electrically connected to the susceptor 16 via a matching unit 88. The first high frequency power supply 89 outputs a high frequency power having a frequency of 27 MHz or above, e.g., 40 MHz. The high frequency power outputted from the first high frequency power supply 89 is used for generating a plasma and will be hereinafter referred to as "high frequency power for plasma generation". The second high frequency power supply 90 outputs a high frequency power having a frequency of 13.56 MHz or less, e.g., 2 MHz. The high frequency power outputted from the second high frequency power supply 90 is used for attracting ions in the plasma and will be hereinafter referred to as "high frequency power for ion attraction". The first high frequency power supply 89 may be electrically connected to the upper electrode 34 via a matching unit 87.

The matching units 87 and 88, for matching a load impedance with internal (or output) impedances of the first and the second high frequency power supply 89 and 90, function such that the load impedance and the internal (or output) impedances of the first and the second high frequency power supply 89 and 90 apparently match when a plasma is generated in the chamber 10.

A gas exhaust port 80 is provided at the bottom portion of the chamber 10. A gas exhaust unit 84 is connected to the gas exhaust port 80 through a gas exhaust line 82. The gas exhaust unit 84 has a vacuum pump such as a turbo molecular pump or the like. The gas exhaust unit 84 can reduce a pressure in the chamber 10 to a desired vacuum level. A loading/unloading port 85 for the wafer W is provided at a sidewall of the chamber 10. The loading/unloading port 85 can be opened/closed by a gate valve 86. A deposition shield 11 for preventing etching-by products (deposits) from being attached to the chamber 10 is detachably provided along an inner surface of the sidewall of the chamber 10. In other words, the deposition shield 11 forms a chamber wall. The deposition shield 11 is also provided at an outer periphery of the inner wall member 26. At a lower portion in the chamber 10, a gas exhaust plate 83 is provided between the deposition shield 11 close to the chamber wall and the deposition shield 11 close to the inner wall member 26. The deposition shield 11 and the gas exhaust plate 83 may be formed by coating aluminum with ceramic such as $Y_2O_3$ or the like.

A conductive member (GND block) 91 is provided at a portion of an inner surface of the deposition shield 11 provided along the inner surface of the sidewall of the chamber 10 at the substantially same height as the height of the wafer W. Due to the presence of the conductive member 91, abnormal discharge is prevented as will be described later.

The respective components of the plasma etching apparatus are connected to and controlled by a control unit (general control device) 95. The control unit 95 is connected to a user interface 96 including a keyboard through which a process manager can input commands to operate the plasma etching apparatus, a display for visualizing an operational state of the plasma processing apparatus, and the like.

The control unit 95 is connected to a storage unit 97 in which control programs for realizing various processes performed by the plasma etching apparatus under the control of the control unit 95 or programs, i.e., recipes, for operating the respective components of the plasma etching apparatus based on processing condition. The recipes may be stored in a hard disk or a semiconductor memory. Or, the recipes may be set in a predetermined position of the storage unit 97 while being stored in a computer-readable storage medium by a portable computer such as a CDROM, a DVD or the like.

In the plasma etching apparatus, if necessary, any recipe is retrieved from the storage unit 97 in response to a command from the user interface 96 or the like and executed by the control unit 95. Accordingly, a desired process in the plasma etching apparatus is performed under the control of the control unit 95.

For example, the control unit 95 controls the respective components of the plasma etching apparatus such that a plasma etching method to be described later is performed. To be specific, under the control of the control unit 95, a silicon-containing deposit is deposited on a metal-containing mask formed on the processing target object by a plasma of a first processing gas while applying a negative DC voltage to the upper electrode 34. Further, under the control of the control unit 95, an etching target film is etched by a plasma of a second processing gas while using the metal-containing mask on which the silicon-containing deposit is deposited as a mask. The processing target object is, e.g., the wafer W.

In order to perform the etching process by the plasma etching apparatus configured as described above, first, the gate valve 86 is opened and the wafer W as an etching target is loaded into the chamber 10 through the loading/unloading port 85 and mounted on the susceptor 16. Then, a processing gas for etching is supplied at a predetermined flow rate from the processing gas supply source 66 to the gas diffusion space 40 and then to the chamber 10 through the gas through holes 41 and the gas injection holes 37. The chamber 10 is exhausted by the gas exhaust unit 84 and a pressure in the chamber 10 is set to be within a range of, e.g., 0.1 Pa to 150 Pa.

In a state where the etching gas is introduced into the chamber 10, a high frequency power for plasma generation is applied at a predetermined power level from the first high frequency power supply 89 to the susceptor 16 serving as the lower electrode and, also, a high frequency for ion attraction is applied at a predetermined power level from the second high frequency power supply 90 to the susceptor 16 serving as the lower electrode. A predetermined DC voltage is applied from the variable DC power supply 50 to the upper electrode 34. A DC voltage is applied from the DC power supply 22 for the electrostatic chuck 18 to the electrode 20 of the electrostatic chuck 18, so that the wafer W is held on the susceptor 16.

The processing gas injected through the gas injection holes 37 formed in the electrode plate 36 of the upper electrode 34 is converted into a plasma by glow discharge generated between the upper electrode 34 and the susceptor serving as the lower electrode by the high frequency powers. A target surface of the wafer W is etched by radicals or ions generated in the plasma.

In the plasma etching apparatus, the high frequency power in a high frequency range (e.g., 10 MHz or above) is supplied from the first high frequency power supply 89 to the susceptor 16 serving as the lower electrode. Therefore, the plasma can be generated at a high density in a desirable state. Accordingly, it is possible to form a high-density plasma even under a lower pressure condition.

(Plasma Etching Method According to the Embodiment)

Figure 3:
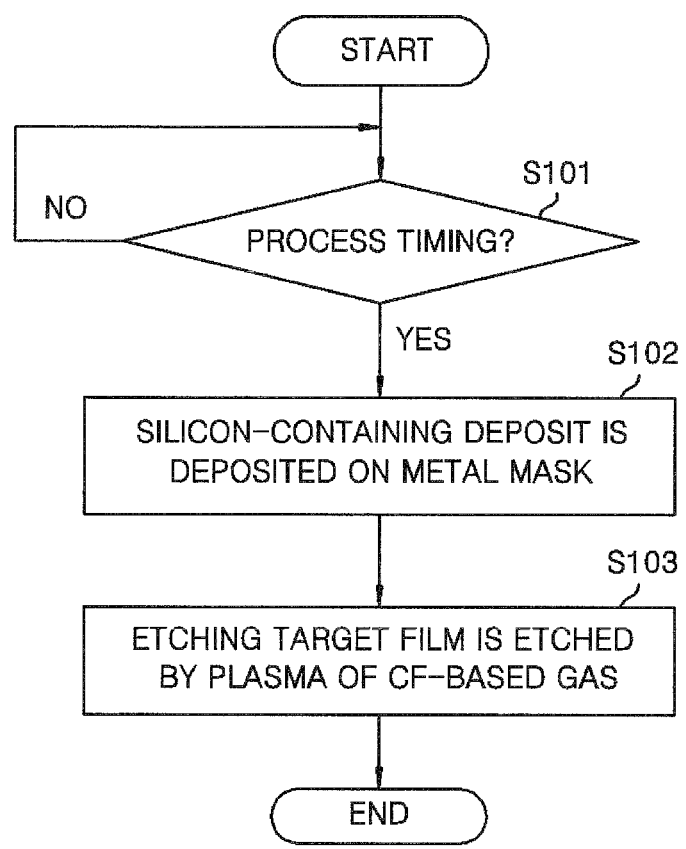
FIG. 3 is a flowchart showing an example of a plasma etching process in the embodiment.

FIG. 3 is a flowchart showing an example of a plasma etching process in the embodiment. As will be described in detail hereinafter, the plasma etching apparatus performs a series of processes on the wafer W on which the etching target film and the metal-containing mask having a predetermined pattern are laminated in that order.

The etching target film is, e.g., a silicon-containing film. The silicon-containing film may contain, e.g., at least one of $SiO_2$, SiOC, SiC and SiN. The metal-containing mask is made of, e.g., a metal, a metal nitride, a metal oxide, a metal carbide or a compound of a metal and silicon. The metal may contain, e.g., at least one of Ti, Ta and W. The metal nitride contains, e.g., at least one of $Ti_3N_4$ and $Ta_3N_5$. The metal oxide is, e.g., $TiO_2$. The metal carbide is, e.g., WC. The compound of the metal and silicon is, e.g., $WSi_2$.

Referring back to FIG. 3, when it is determined to be process timing (step S101), the plasma etching apparatus performs a process of depositing a silicon-containing deposit on the surface of the metal-containing mask by the plasma of a first processing gas while applying the negative DC voltage to the silicon-containing upper electrode 34 (step S102). The first processing gas contains a rare gas. The rare gas contains, e.g., at least one of Ar, He, Xe and Ne.

Figure 4B:
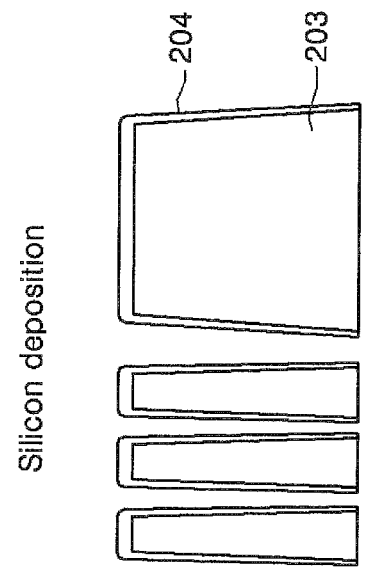
FIGS. 4A and 4B show a deposition process in the embodiment.
Figure 4A:
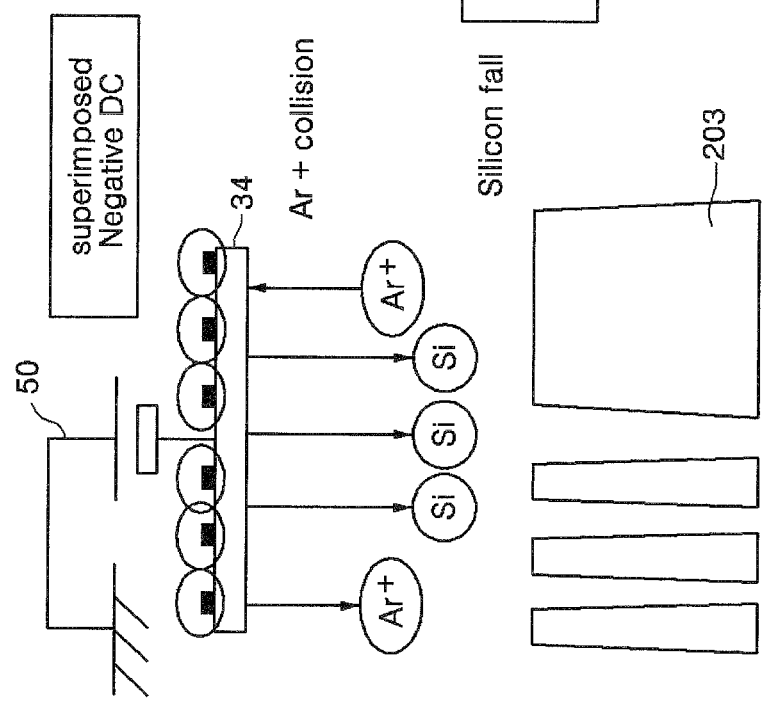

FIGS. 4A and 4B show the deposition process in the embodiment. Under the control of the control unit 95, the plasma etching apparatus applies the high frequency power from the first high frequency power supply 89 and also applies a predetermined DC voltage to the upper electrode 34 connected to the variable DC power supply 50. In this case, the high frequency power for ion attraction is not applied from the second high frequency power supply 90. In other words, as shown in FIG. 4A, when the plasma is generated, the control unit 95 applies a predetermined DC voltage from the variable DC power supply 50 to the upper electrode 34. More preferably, the plasma etching apparatus applies the voltage from the variable DC power supply 50 such that a self-bias voltage Vdc on the surface of the electrode plate 36 is increased to the extent that a desired (appropriate) sputter effect can be realized on the surface of the electrode plate 36 which is the surface of the upper electrode 34, i.e., such that an absolute value of the Vdc on the surface of the upper electrode 34 is increased. Then, the control unit 95 supplies the first processing gas, e.g., Ar gas, into the chamber 10.

Therefore, as can be seen from FIG. 4A, collision of ions against the surface of the electrode plate 36 is accelerated and, thus, a falling amount of electron beam or a falling amount of silicon forming the upper electrode 34 is increased. In the example shown in FIG. 4A, Ar ions collide with the surface of the electrode plate 36 and, thus, silicon forming the electrode plate 36 falls on the metal-containing mask 203. Accordingly, as can be seen from FIG. 4B, a silicon-containing deposit 204 is deposited on the surface of the metal-containing mask 203. As a consequence, the plasma resistance of the metal-containing mask 203 is improved and scattering of the metal from the metal-containing mask 203 is suppressed, thereby preventing the etching of the etching target film from being disturbed by the metal compound. As a result, it is possible to avoid etching stop caused by the material of the metal-containing mask 203.

Referring back to FIG. 3, the plasma etching apparatus performs an etching process of etching the etching target film by the plasma of the second processing gas while using the metal-containing mask on which the silicon-containing deposit is deposited as the mask (step S103). The second processing gas contains, e.g., a CF-based gas. The CF-based gas contains, e.g., at least one of $C_4F_6$ gas, $C_5F_8$ gas, $C_4F_8$ gas, $CF_4$ gas, $CHF_3$ gas and $CH_2F_2$ gas.

Effect of the Embodiment

In accordance with the embodiment, the silicon-containing deposit is deposited on the metal-containing mask formed on the processing target object by the plasma of the first processing gas while applying the negative DC voltage to the upper electrode 34, and the etching target film is etched by the plasma of the second processing gas while using the metal-containing mask on which the silicon-containing deposit is deposited as the mask. Accordingly, the plasma resistance of the metal-containing mask is improved and scattering of the metal from the metal-containing mask is suppressed, thereby preventing the etching of the etching target film from being disturbed by the metal compound. As a result, it is possible to avoid etching stop caused by the material of the metal-containing mask.

Other Embodiments

While the plasma etching method and the plasma etching apparatus according to the embodiment have been described, the disclosed technique is not limited thereto. Hereinafter, other embodiments will be described.

In the above embodiments, there is described the example in which the silicon-containing deposit is deposited on the metal-containing mask by applying a negative DC voltage to the upper electrode 34. However, the present disclosure is not limited thereto. For example, instead of the negative DC voltage, a high frequency power having a frequency of 13.56 MHz or less, e.g., 2 MHz, may be applied to the upper electrode 34. Or, the high frequency power having a frequency of 13.56 MHz or less, e.g., 2 MHz, may be applied to the lower electrode 16. Or, the high frequency power having a frequency of 13.56 MHz or less, e.g. 2 MHz, may be applied to both of the upper electrode 34 and the lower electrode 16. In the case of applying the high frequency power in the above-described frequency range to the upper electrode 34, or to the upper electrode 16, or to both of the upper electrode 34 and the lower electrode 16, the same sputter effect as that obtained by applying the negative DC voltage to the upper electrode 34 is obtained. Accordingly, the silicon-containing deposit is deposited on the metal-containing mask.

Further, in the above embodiments, there is described the example in which the upper electrode 34 is made of the silicon-containing material. However, the present disclosure is not limited thereto. For example, the upper electrode 34 may be made of a metal-containing material. The metal-containing material contains a metal, e.g., ruthenium or the like. The metal such as ruthenium or the like is an example of an element forming the upper electrode 34. When the upper electrode 34 is made of the metal-containing material, the metal-containing material is deposited on the metal-containing mask by applying the negative DC voltage to the upper electrode 34 under the control of the control unit 95.

It is considered that, when the upper electrode 34 is made of the silicon-containing material or the metal-containing material, the following phenomenon occurs. In other words, a region where atoms forming the metal-containing mask are bonded with atoms forming the upper electrode 34, which are fallen, is formed on an interface between the metal-containing mask and the deposit deposited on the metal-containing mask and, thus, the plasma resistance of the metal-containing mask is improved. For example, in the case of using the silicon-containing upper electrode 34, a region containing a metal silicide is formed on the interface between the metal-containing mask and the deposit deposited on the metal-containing mask.

(Repetition of the Deposition Process and the Etching Process)

The plasma etching apparatus may repeatedly perform the deposition process and the etching process alternately. By alternately repeating the deposition process and the etching process, the plasma resistance of the metal-containing mask is further improved. Therefore, the scattering of the metal from the metal-containing mask is further suppressed. Accordingly, the etching of the target film is not disturbed by the metal compound. As a result, it is possible to more reliably avoid the etching stop caused by the material of the metal-containing mask.

When the plasma etching apparatus repeatedly performs the deposition process and the etching process alternately, the etching process is performed for a processing time longer than that of the deposition process. Accordingly, even when the silicon-containing deposit is relatively thickly deposited on the etching target film besides the metal-containing mask during the deposition process, it is possible to effectively remove the silicon-containing deposit on the etching target film together with the etching target film during the etching process.

(Processing Time of the Deposition Process)

In another embodiment, the plasma etching apparatus may increase the processing time of the deposition process as a predetermined pattern of the etching target film becomes deeper by the repetition of the deposition process and the etching process. The predetermined pattern of the etching target film may be a hole or a groove. Hereinafter, the case of increasing the processing time of the deposition process will be described in detail with reference to FIGS. 5A to 5C.

FIGS. 5A to 5C show exemplary cross sections of a wafer W after each process in the case of repeating the deposition process and the etching process. Here, the case of repeating the deposition process and the etching process three times will be described as an example. The plasma etching apparatus performs a series of processes on a wafer W in which an etching target film 301 and a metal-containing mask 302 having a predetermined pattern are laminated in that order.

First, the plasma etching apparatus performs a first deposition process. After the first deposition process, the wafer W has a cross section shown in (a-1) of FIG. 5A, for example. In other words, a silicon-containing deposit 303*a* is deposited on the metal-containing mask 302 by performing the first deposition process.

Next, the plasma etching apparatus performs a first etching process. After the first etching process, the wafer W has a cross section shown in (b-1) of FIG. 5A, for example. In other words, a predetermined pattern 304 is formed on the etching target film 301 by performing the first etching process.

Next, the plasma etching apparatus performs a second deposition process. The plasma etching apparatus performs the second deposition process for a period longer than that of the first deposition process. After the second deposition process, the wafer W has a cross section shown in (a-2) of FIG. 5B, for example. In other words, a silicon-containing deposit 303*b* is deposited more thickly than the silicon-containing deposit 303*a* on the surface of the metal-containing mask 302 by performing the second deposition process for a period longer than that of the first deposition process.

Next, the plasma etching apparatus performs a second etching process. After the second etching process, the wafer W has a cross section shown in (b-2) of FIG. 5B, for example. In other words, the predetermined pattern 304 formed in the etching target film 301 becomes deeper by performing the second etching process.

Next, the plasma etching apparatus performs a third deposition process. At this time, the plasma etching apparatus performs the third deposition process for a period longer than that of the second deposition process. After the third deposition process, the wafer W has a cross section shown in (a-3) of FIG. 5C, for example. In other words, a silicon-containing deposit 303c is deposited more thickly than the silicon-containing deposit 303b on the surface of the metal-containing mask 302 by performing the third deposition process for a period longer than that of the second deposition process.

Next, the plasma etching apparatus performs a third etching process. After the third etching process, the wafer W has a cross section shown in (b-3) of FIG. 5C, for example. In other words, the predetermined pattern 304 formed in the etching target film 301 become deeper by performing the third etching process.

As the hole or the groove formed in the etching target film becomes deeper by the repetition of the deposition process and the etching process, the silicon-containing deposit can be thickly deposited on the metal-containing mask by increasing the processing time of the deposition process. As a result, the plasma resistance of the metal-containing mask with respect to the etching target film is improved and the etching stop caused by the material of the metal-containing mask can be more reliably avoided. The amount of the silicon-containing deposit that can reach the bottom portion of the predetermined film is reduced as the predetermined pattern formed in the etching target film becomes deeper. Therefore, even if the processing time of the deposition process is increased, the deterioration of the release property of the predetermined pattern is avoided.

(Negative DC Voltage Applied to the Upper Electrode in the Deposition Process)

In another embodiment, the plasma etching apparatus may increase an absolute value of the negative DC voltage applied to the upper electrode 34 in the deposition process as the predetermined pattern formed in the etching target film becomes deeper by the repetition of the deposition process and the etching process. In that case, the energy of ions colliding with the upper electrode 34 is increased and the sputtering amount of silicon contained in the upper electrode 34 is increased. Therefore, a falling amount of the sputtered silicon onto the metal-containing mask is increased. Accordingly, the silicon deposit on the metal-containing mask may become gradually thicker. As a result, the plasma resistance of the metal-containing mask with respect to the etching target film is improved and it is possible to more reliably avoid the etching stop caused by the material of the metal-containing mask.

(Pressure in the Deposition Process)

In another embodiment, the plasma etching apparatus may increase a pressure in the deposition process as the predetermined pattern formed in the etching target film becomes deeper by the repetition of the deposition process and the etching process. In that case, the flux of ions colliding with the upper electrode 34 is increased compared to the case in which the pressure is not changed, and the sputtering amount of silicon contained in the upper electrode 34 is increased. Therefore, the falling amount of the sputtered silicon onto the surface of the metal-containing mask is increased. Accordingly, the silicon deposit on the metal-containing mask may become thicker. As a result, the plasma resistance of the metal-containing mask with respect to the etching target film is improved and it is possible to more reliably avoid the etching stop caused by the material of the metal-containing mask.

(High Frequency Power for Ion Attraction in the Etching Process)

In another embodiment, the plasma etching apparatus may increase the high frequency power for ion attraction in the etching process as the predetermined pattern formed in the etching target film becomes deeper by the repetition of the deposition process and the etching process. Hereinafter, an example of increasing the high frequency power for ion attraction in the etching process will be described with reference to FIGS. 6A to 6C.

FIGS. 6A to 6C show other exemplary cross sections of the wafer W after each process in the case of repeating the deposition process and the etching process. Here, the case of repeating the deposition process and the etching process three times will be described as an example. The plasma etching apparatus performs a series of processes on the wafer W in which the etching target film 301 and the metal-containing mask 302 having a predetermined pattern are laminated in that order.

First, the plasma etching apparatus performs a first deposition process. After the first deposition process, the wafer W has a cross section shown in (a-1) of FIG. 6A, for example. In other words, the silicon-containing deposit 303a is deposited on the surface of the metal-containing mask 302 by performing the first deposition process.

Next, the plasma etching apparatus performs a first etching process. After the first etching process, the wafer W has a cross section shown in (b-1) of FIG. 6A, for example. In other words, the predetermined pattern 304 is formed on the etching target film 301 by performing the first etching process.

Next, the plasma etching apparatus performs a second deposition process. The plasma etching apparatus performs the second deposition process for a period longer than that of the first deposition process. After the second deposition process, the wafer W has a cross section shown in (a-2) of FIG. 6B, for example. In other words, a silicon-containing deposit 303b is deposited more thickly than the silicon-containing deposit 303a on the surface of the metal-containing mask 302 by performing the second deposition process for a period longer than that of the first deposition process.

Next, the plasma etching apparatus performs a second etching process. At this time, the plasma etching apparatus sets the high frequency power for ion attraction in the second etching process to be greater than that in the first etching process. After the second etching process, the wafer W has a cross section shown in (b-2) of FIG. 6B, for example. In other words, the predetermined pattern 304 formed in the etching target film 301 becomes deeper by performing the second etching process. Further, by increasing the high frequency power for ion attraction in the second etching process, the energy of ions incident on the predetermined pattern 304 is increased. Accordingly, the straightness of the ions incident on the predetermined pattern 304 is improved.

Next, the plasma etching apparatus performs a third deposition process. At this time, the plasma etching apparatus performs the third deposition process for a period longer than that of the second deposition process. After the third deposition process, the wafer W has a cross section shown in (a-3) of FIG. 6C, for example. In other words, the silicon-containing deposit 303c is deposited more thickly than the silicon-containing deposit 303b on the surface of the metal-containing mask 302 by performing the third deposition process for a period longer than that of the second deposition process.

Next, the plasma etching apparatus performs a third etching process. At this time, the plasma etching apparatus sets the high frequency power for ion attraction in the third etching process to be greater than that in the second etching process. After the third etching process, the wafer W has a cross section shown in (b-3) of FIG. 6C, for example. In other words, the predetermined pattern 304 formed in the etching target film 301 becomes deeper by performing the third etching process. By further increasing the high frequency power for ion attraction in the third etching process, the energy of ions incident on the predetermined pattern 304 is further increased. Accordingly, the straightness of the ions incident on the predetermined pattern 304 is improved.

As the predetermined pattern formed in the etching target film becomes deeper, the straightness of the ions incident on the predetermined pattern is improved by increasing the high frequency power for ion attraction in the etching process. At this time, the thickness of the silicon-containing deposit on the metal-containing mask is increased and, thus, the amount of ions obliquely incident on a sidewall of the predetermined pattern can be reduced without deteriorating the plasma resistance of the metal-containing mask with respect to the etching target film. As a result, it is possible to suppress occurrence of bowing in which the predetermined pattern becomes a barrel-shaped pattern or occurrence of bending in which the shape of the predetermined pattern becomes distorted, while suppressing scattering of metal from the metal-containing mask.

(Frequency of the High Frequency Power for Ion Attraction in the Etching Process)

In another embodiment, the plasma etching apparatus may decrease the frequency of the high frequency power for ion attraction in the etching process as the predetermined pattern formed in the etching target film becomes deeper by the repetition of the deposition process and the etching process. In this case, the energy of ions incident on the predetermined pattern formed in the etching target film is increased. Accordingly, the straightness of the ions incident on the predetermined pattern is improved. At this time, the thickness of the silicon-containing deposit on the metal-containing mask is increased and, thus, the amount of ions obliquely incident on the sidewall of the predetermined pattern can be reduced without deteriorating the plasma resistance of the metal-containing mask with respect to the etching target film. As a result, it is possible to suppress occurrence of bowing in which the predetermined pattern becomes a barrel-shaped pattern or occurrence of bending in which the shape of the predetermined pattern becomes distorted, while suppressing scattering of metal from the metal-containing mask.

(Pressure in the Etching Process)

In another embodiment, the plasma etching apparatus may decrease the pressure in the etching process as the predetermined pattern formed in the etching target film becomes deeper by the repetition of the deposition process and the etching process. Accordingly, the straightness of the ions incident on the predetermined pattern is improved. At this time, the thickness of the silicon-containing deposit on the metal-containing mask is increased and, thus, the amount of ions obliquely incident on the sidewall of the predetermined pattern can be reduced without deteriorating the plasma resistance of the metal-containing mask with respect to the etching target film. As a result, as in the case of increasing the high frequency power for ion attraction in the etching process, it is possible to suppress occurrence of bowing in which the predetermined pattern becomes a barrel-shaped pattern or occurrence of bending in which the shape of the predetermined pattern becomes distorted, while suppressing scattering of metal from the metal-containing mask.

(Oxidation Process)

In another embodiment, the plasma etching apparatus may further perform, between the deposition process and the etching process, an oxidation process of forming an oxidation region by oxidizing the surface of the silicon-containing deposit deposited on the metal-containing mask by a plasma of an oxygen-containing gas. In this case, in the etching process, the plasma etching apparatus etches the etching target film and removes the oxidation region by a plasma of the second processing gas. The oxygen-containing gas contains at least one of, e.g., $O_2$, $CO_2$ and CO. Hereinafter, the case of performing the oxidation process between the deposition process and the etching process will be described in detail with reference to FIGS. 7A to 7C.

FIGS. 7A to 7C shows exemplary cross sections of a wafer W after each process in the case of performing the oxidation process between the deposition process and the etching process. Here, the plasma etching apparatus performs a series of processes on a wafer W in which an etching target film 401 and a metal-containing mask 402 having a predetermined pattern are laminated in that order. A predetermined pattern 404 is formed in the etching target film 401.

First, the plasma etching apparatus performs the deposition process. After the deposition process, the wafer W has a cross section shown in FIG. 7A, for example. In other words, a silicon-containing deposit 403 is deposited on the surface of the metal-containing mask 402 by performing the deposition process. A part of the silicon-containing deposit 403 is attached to an opening of the pattern of the metal-containing mask 402. If the part of the silicon-containing deposit 403, which is attached to the opening of the pattern of the metal-containing mask 402, is thick, the opening of the pattern of the metal-containing mask 402 may be clogged.

Next, the plasma etching apparatus performs the oxidation process by using a plasma of $O_2$. After the oxidation process, the wafer W has a cross section shown in FIG. 7B, for example. In other words, the surface of the silicon-containing deposit 403 is oxidized and an oxidation region 403a is formed.

Next, the plasma etching apparatus performs the etching process. After the etching process, the wafer W has a cross section shown in FIG. 7C, for example. In other words, by performing the etching process, the predetermined pattern of the etching target film 401 becomes deeper and the oxidation region 403a is removed from the silicon-containing deposit 403. Accordingly, the part of the silicon-containing deposit 403 which is attached to the opening of the pattern of the metal-containing mask 402 becomes thinner.

By removing the oxidation region formed by oxidizing the surface of the silicon-containing deposit on the metal-containing mask during the etching of the etching target film, the part of the silicon-containing deposit which is attached to the opening of the pattern of the metal-containing mask can become thinner. As a result, the clogging of the opening of the pattern of the metal-containing mask can be suppressed.

(Repetition of the Deposition Process, the Oxidation Process and the Etching Process)

In another embodiment, the plasma etching apparatus may repeat the deposition process, the oxidation process and the etching process in that order. In this case, the etching is performed such that a part of the silicon-containing deposit which is attached to the opening of the pattern of the metal-containing mask becomes thinner and the plasma resistance of the metal-containing mask becomes improved. As a result, it is possible to more stably suppress the clogging of the opening of the pattern of the metal-containing mask and also possible to more reliably avoid the etching stop caused by the material of the metal-containing mask.

(Processing Time of the Oxidation Process)

In another embodiment, the plasma etching apparatus may increase the processing time of the oxidation process as the predetermined pattern formed in the etching target film becomes deeper by the repetition of the deposition process, the oxidation process and the etching process. In that case, the thickness of the oxidation region can be increased in a stepwise manner depending on the thickness of the silicon-containing deposit on the metal-containing mask and the oxidation region can be appropriately removed during the etching of the etching target film. As a result, even when the deposition process, the oxidation process and the etching process are repeated in that order, the clogging of the opening of the pattern of the metal-containing mask can be suppressed.

(Pressure in the Oxidation Process)

In another embodiment, the plasma etching apparatus may increase the pressure in the oxidation process as the predetermined pattern formed in the etching target film becomes deeper by the repetition of the deposition process, the oxidation process and the etching process. In that case, the thickness of the oxidation region can be increased in a stepwise manner depending on the thickness of the silicon-containing deposit on the metal-containing mask and the oxidation region can be appropriately removed during the etching of the etching target film. As a result, even when the deposition process, the oxidation process and the etching process are repeated in that order, the clogging of the opening of the pattern of the metal-containing mask can be suppressed.

(High Frequency Power for Plasma Generation in the Oxidation Process)

In another embodiment, the plasma etching apparatus may increase the high frequency power for plasma generation in the oxidation process as the predetermined pattern formed in the etching target film becomes deeper by the repetition of the deposition process, the oxidation process and the etching process. In that case, the thickness of the oxidation region can be increased in a stepwise manner depending on the thickness of the silicon-containing deposit on the metal-containing mask and the oxidation region can be appropriately removed during the etching of the etching target film. As a result, even when the deposition process, the oxidation process and the etching process are repeated in that order, the clogging of the opening of the pattern of the metal-containing mask can be suppressed.

Hereinafter, the plasma etching method will be described in detail by using test examples. However, the plasma etching method is not limited to the following test example.

Comparative Example

In the comparative example, an etching process was performed on a processing target object. A test chip having a following structure was used as the processing target object. The etching process was performed under the following condition.

<Processing Target Object>
  Etching target film: $SiO_2$ film
  Metal-containing mask: $Ti_3N_4$ <Etching Process>
  Processing gas: $C_4F_6/Ar/O_2$=5/950/4 sccm
  Pressure: 2.7 Pa (20 mTorr)
  High frequency power from the first high frequency power supply: 100 W
  High frequency power from the second high frequency power supply: 150 W
  DC voltage applied to the upper electrode: −300 V
  Processing time: 600 seconds Test Example In a test example, a deposition process of depositing a silicon-containing deposit on a processing target object was performed and, then, an etching process was performed. The deposition process and the etching process were repeated 50 times alternately. The processing target object used in the test example has the same structure as that of the processing target object used in the comparative example. The deposition process was performed under the following condition. The etching process was performed under the same condition as that in the comparative example except for the processing time.

Figure 8:
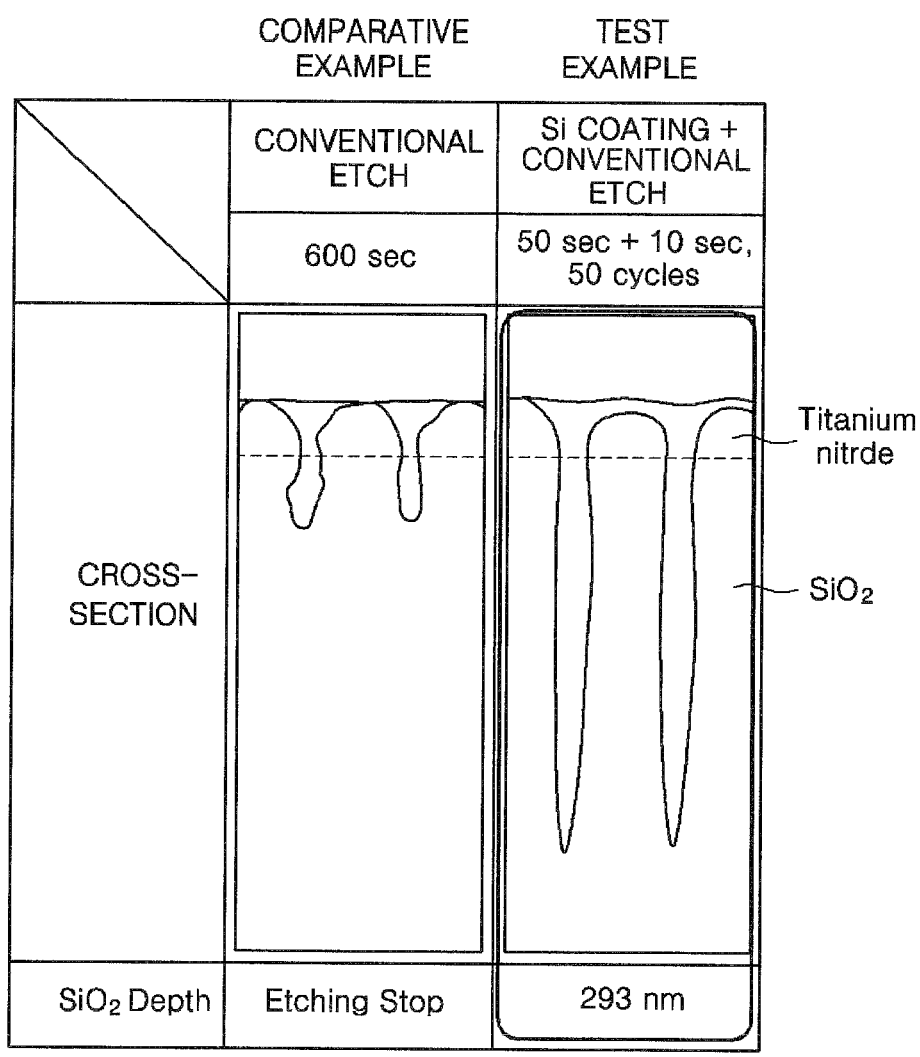
FIG. 8 shows processing results in a comparative example and a test example.

<Deposition Process>
  Processing gas: Ar=800 sccm
  Pressure: 6.7 Pa (50 mTorr)
  High frequency power from the first high frequency power supply: 300 W
  High frequency power from the second high frequency power supply: 0 W
  DC voltage applied to the upper electrode: −900 V
  Processing time: 5 seconds
<Etching Process>
  Processing time: 10 seconds FIG. 8 shows processing results in the comparative example and the test example. In FIG. 8, "Conventional Etch: 600 sec" indicates the processing target object that has been subjected to the etching process in the comparative example. "Si Coating+Conventional Etch: 5 sec+10 sec, 50 cycles" indicates the processing target object on which the deposition process and the etching process in the test example were repeatedly performed 50 times alternately. "Cross-section" in FIG. 8 shows traced diagrams of images obtained by enlarging cross sections of the processing target objects.

In FIG. 8, "$SiO_2$ Depth" indicates a depth of an etching hole formed in the $SiO_2$ film.

As shown in FIG. 8, in the comparative example, etching stop was caused by the metal-containing mask. On the other hand, in the test example, the depth of the etching hole was 293 nm, which satisfied a predetermined allowable specification.

As can be seen from the comparison between the test example and the comparative example, in the test example, the etching stop caused by the material of the metal-containing mask can be avoided by depositing the silicon-containing deposit.

In the case of consecutively processing a plurality of processing target objects, sputtered atoms may be cumulatively attached to the inner wall of the chamber 10 due to sputtering of the upper electrode 34. Therefore, a cleaning process of removing the deposit on the inner wall of the chamber 10 may be performed whenever one processing target object has been processed or on a lot basis.

While the disclosure has been shown and described with respect to the embodiments, it will be understood by those skilled in the art that various changes and modifications may be made without departing from the scope of the disclosure as defined in the following claims.

What is claimed is:

1. A plasma etching method for a processing target object on which an etching target film and a metal-containing mask having a predetermined pattern are laminated in the order, comprising:
sputtering an upper electrode of a plasma etching apparatus by a plasma of a first processing gas, for depositing a deposit, which contains an element forming the upper electrode on the metal-containing mask having the predetermined pattern, wherein the element forming the upper electrode contains silicon; and
etching the etching target film by a plasma of a second processing gas while using the metal-containing mask on which the deposit is deposited as a mask.

2. The plasma etching method of claim 1, wherein in said depositing, the deposit containing the element forming the upper electrode is deposited on the metal-containing mask by applying a negative DC voltage to the upper electrode, or by applying a high frequency power having a frequency of 13.56 MHz or less to the upper electrode, or by applying a high frequency power having a frequency of 13.56 MHz or less to the lower electrode.

3. The plasma etching method of claim 2, wherein said depositing and said etching are repeated alternately.

4. The plasma etching method of claim 3, wherein a processing time of said depositing is increased as a predetermined pattern formed in the etching target film becomes deeper by the repetition of said depositing and said etching.

5. The plasma etching method of claim 3, wherein an absolute value of the negative DC voltage applied to the upper electrode in said depositing is increased as the predetermined pattern formed in the etching target film becomes deeper by the repetition of said depositing and said etching.

6. The plasma etching method of claim 3, wherein a pressure in said depositing is increased as a predetermined pattern formed in the etching target film becomes deeper by the repetition of said depositing and said etching.

7. The plasma etching method of claim 3, wherein a high frequency power for ion attraction in said etching is increased as a predetermined pattern formed in the etching target film becomes deeper by the repetition of said depositing and said etching.

8. The plasma etching method of claim 3, wherein a frequency of the high frequency power for ion attraction in said etching is decreased as a predetermined pattern formed in the etching target film becomes deeper by the repetition of said depositing and said etching.

9. The plasma etching method of claim 3, wherein a pressure in said etching is decreased as a predetermined pattern formed in the etching target film becomes deeper by the repetition of said depositing and said etching.

10. The plasma etching method of claim 1, further comprising:
oxidizing a surface of the deposit deposited on the metal-containing mask by a plasma of an oxygen-containing gas and forming an oxidation region, between said depositing and said etching,
wherein in said etching, the etching target film is etched and the oxidation region is removed by the plasma of the second processing gas.

11. The plasma etching method of claim 10, wherein said depositing, said oxidizing and said etching are repeated in that order.

12. The etching method of claim 11, wherein a processing time in said oxidizing is increased as a predetermined pattern formed in the etching target film becomes deeper by the repetition of said depositing, said oxidizing and said etching.

13. The plasma etching method of claim 11, wherein a pressure in said oxidizing is increased as a predetermined pattern formed in the etching target film becomes deeper by the repetition of said depositing, said oxidizing and said etching.

14. The plasma etching method of claim 11, wherein a frequency power for plasma generation in said oxidizing is increased as a predetermined pattern formed in the etching target film becomes deeper by the repetition of said depositing, said oxidizing and said etching.

15. The plasma etching method of claim 1, wherein the metal-containing mask is made of a metal, a metal nitride, a metal oxide, a metal carbide or a compound of a metal and silicon.

16. The plasma etching method of claim 15, wherein the metal contains at least one of Ti, Ta and W.

17. The plasma etching method of claim 1, wherein the etching target film is a silicon-containing film.

18. The plasma etching method of claim 1, wherein the first processing gas contains a rare gas.

19. The plasma etching method of claim 1, wherein the second processing gas contains a CF-based gas.

* * * * *